United States Patent
Lu

(10) Patent No.: US 8,238,081 B2
(45) Date of Patent: Aug. 7, 2012

(54) POWER SUPPLY

(75) Inventor: Shao-Feng Lu, Taoyuan County (TW)

(73) Assignees: FSP Technology Inc., Taoyuan, Taoyuan County (TW); 3Y Power Technology (Taiwan), Inc., Guishan Township, Taoyuan County (TW)

( * ) Notice: Subject to any disclaimer, the term of this patent is extended or adjusted under 35 U.S.C. 154(b) by 322 days.

(21) Appl. No.: 12/752,123

(22) Filed: Apr. 1, 2010

(65) Prior Publication Data

US 2011/0242759 A1    Oct. 6, 2011

(51) Int. Cl.
G06F 1/06    (2006.01)
H05K 5/00    (2006.01)

(52) U.S. Cl. .............................. 361/679.02; 361/679.49

(58) Field of Classification Search .................. 174/520, 174/549; 361/679.02, 679.6, 679.49
See application file for complete search history.

(56) References Cited

U.S. PATENT DOCUMENTS

| | | | | |
|---|---|---|---|---|
| 4,731,703 A * | 3/1988 | Tsukaguchi et al. | .......... | 361/727 |
| 5,460,441 A * | 10/1995 | Hastings et al. | .............. | 312/298 |
| 5,612,854 A * | 3/1997 | Wiscombe et al. | ........... | 361/727 |
| 5,790,372 A * | 8/1998 | Dewey et al. | ............ | 361/679.58 |
| 6,038,126 A * | 3/2000 | Weng | ........................ | 361/679.01 |
| 6,288,332 B1 * | 9/2001 | Liu et al. | ........................ | 174/542 |
| 6,330,161 B1 * | 12/2001 | Smith et al. | .................... | 361/724 |
| 7,542,269 B2 * | 6/2009 | Chen et al. | ............... | 361/679.02 |
| 8,075,070 B2 * | 12/2011 | Fan et al. | .................... | 312/223.2 |
| 2002/0089818 A1 * | 7/2002 | Chen | ............................ | 361/683 |
| 2005/0117290 A1 * | 6/2005 | Chen et al. | .................... | 361/686 |
| 2005/0122673 A1 * | 6/2005 | Chen et al. | .................... | 361/683 |
| 2006/0139865 A1 * | 6/2006 | Chen et al. | .................... | 361/683 |

* cited by examiner

*Primary Examiner* — Hung Ngo

(74) *Attorney, Agent, or Firm* — Winston Hsu; Scott Margo

(57) ABSTRACT

A power supply including a housing, a sliding member, a plurality of terminals and a fan module is provided. The housing has an opening and an inner sidewall. The sliding member is disposed on the inner sidewall of the housing. The sliding member has at least one fixing slot parallel to the inner sidewall. The terminals are disposed on the sliding member and can slidably move parallel to the inner sidewall. The fan module is mounted in the housing from the opening. A terminal connector is disposed on an outer sidewall of the fan module and located on a moving direction of the terminals, so that the terminal connector can be electrically connected to the terminals.

7 Claims, 2 Drawing Sheets

POWER SUPPLY

BACKGROUND OF THE INVENTION

1. Field of the Invention

The present invention relates to a power supply. More particularly, the present invention relates to a power supply having sliding terminals.

2. Description of Related Art

With a quick development of electronic technology, power supplies are generally equipped to various electronic devices for providing power. Generally, the power supply is mainly used to convert alternating currents (AC) into stable direct currents (DC) required by various electronic devices. Moreover, a fan module is generally connected to an external power slot or signal slot through golden fingers or a circuit board, so that a fan of the fan module can generate cooling airflow to exhaust heat generated by the power supply to external of the electronic device.

However, an assembling space of the fan module is generally small, and it is not easy to confirm whether the golden finger or the circuit board has been inserted in the power slot or the signal slot. Therefore, in case of excessive current, abnormal assembling or misoperation, the fan module is probably damaged. Meanwhile, the conventional fan module does not have a design of an anti-collision structure, so that the exposed golden finger or the circuit board is liable to be damaged during the assembling, and therefore a service lifespan of the fan module is reduced.

SUMMARY OF THE INVENTION

The present invention is directed to a power supply, in which damage of a fan module occurred during assembling can be avoided.

The present invention provides a power supply including a housing, a sliding member, a plurality of terminals and a fan module. The housing has an opening and an inner sidewall. The sliding member is disposed on the inner sidewall of the housing. The sliding member has a plurality of fixing slots parallel to the inner sidewall. The terminals are disposed on the sliding member and are capable of slidably moving parallel to the inner sidewall. The fan module is mounted in the housing from the opening. A terminal connector is disposed on an outer sidewall of the fan module and located on a moving direction of the terminals, so that the terminal connector is suitable for being electrically connected to the terminals.

In an embodiment of the present invention, the power supply further includes a circuit board fixed on the sliding member, and the terminals are disposed on the circuit board and are electrically connected to the circuit board.

In an embodiment of the present invention, the housing has a plurality of convex pillars disposed on the inner sidewall, and the convex pillars are respectively buckled in the fixing slots.

In an embodiment of the present invention, the inner sidewall has an assembling hole, and the sliding member is configured with an assembling member corresponding to the assembling hole, the assembling member penetrates through the assembling hole from external of the housing, and is fixed on the sliding member, and the assembling member is capable of horizontally moving within the assembling hole.

In an embodiment of the present invention, the inner sidewall has a locking hole, and the sliding member is configured with a locking member corresponding to the locking hole. The locking member penetrates through the locking hole from external of the housing, and is fixed on the sliding member.

In an embodiment of the present invention, the outer sidewall of the fan module has an anti-collision tenon used for pre-warning a collision between the fan module and the sliding member.

In an embodiment of the present invention, the sliding member has a buckle plate, and the outer sidewall of the fan module has a positioning tenon, and the buckle plate is buckled to the positioning tenon.

According to the above descriptions, in the present invention, the sliding member and the terminals are disposed on the inner sidewall of the power supply, so that the terminals are capable of slidably moving parallel to the inner sidewall, and are electrically connected to the terminal connector. Moreover, the sliding member can be temporarily fixed through the locking member, so that shaking of the sliding member is prevented to avoid a poor contact of the terminals. Further, the outer sidewall of the fan module has an anti-collision tenon, which can pre-warn a collision between the fan module and the sliding member, so as to avoid the fan module colliding the terminals with a weaker structural strength, and increase a service lifespan thereof.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
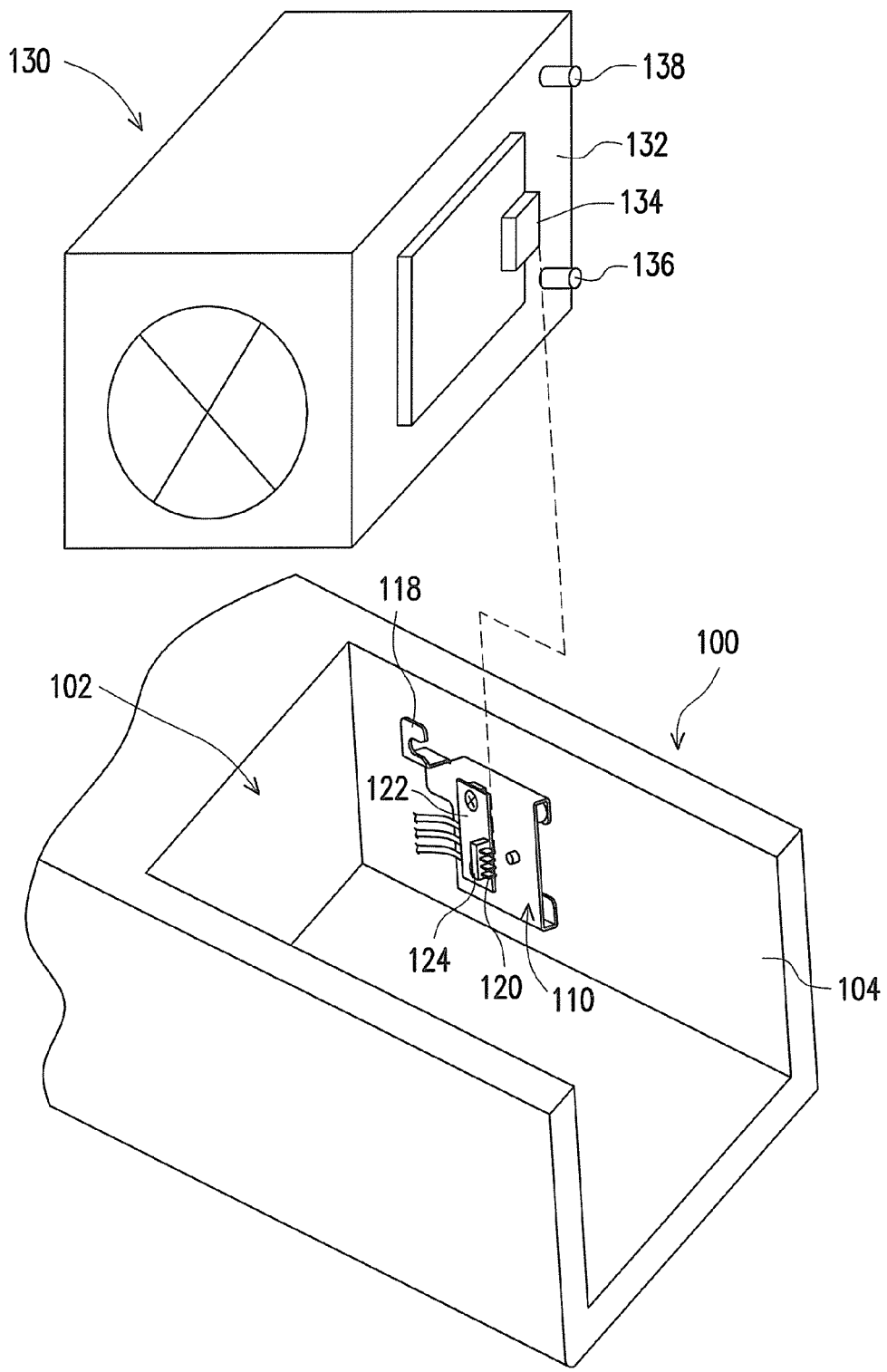
FIG. 1 is an exploded view of a power supply according to an embodiment of the present invention.
Figure 2A:
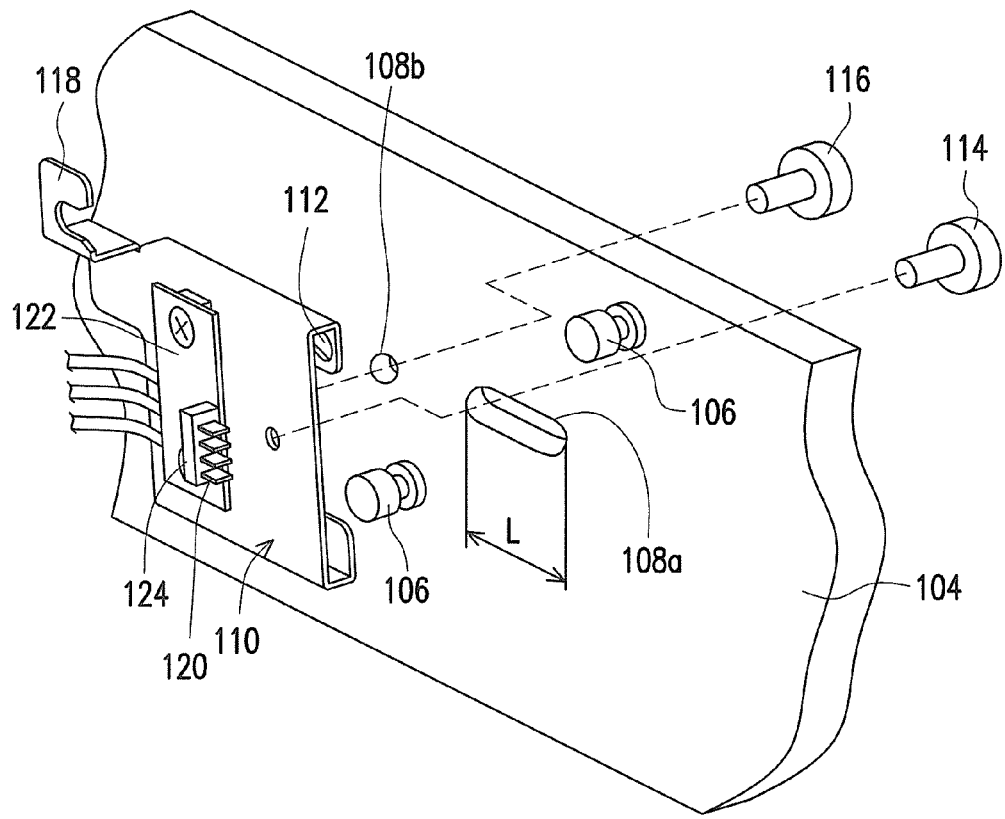
FIG. 2A is an exploded view of a sliding member assembled to an inner sidewall of FIG. 1.
Figure 2B:
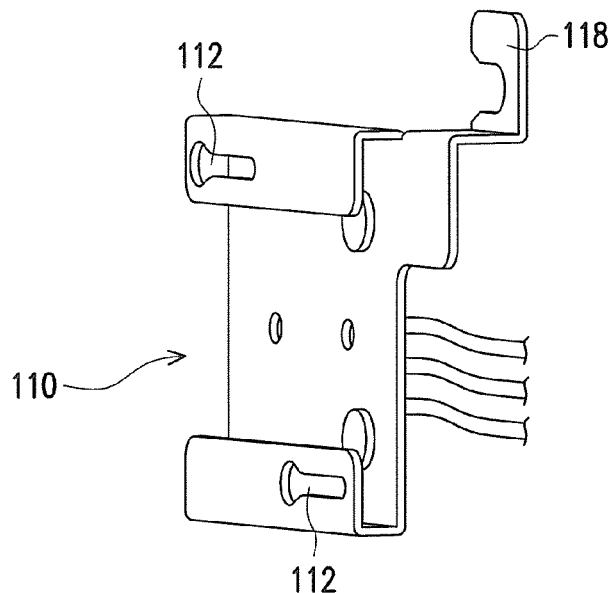
FIG. 2B is a schematic diagram illustrating another side of a sliding member of FIG. 2A.

FIG. 1 is an exploded view of a power supply according to an embodiment of the present invention. FIG. 2A is an exploded view of a sliding member assembled to an inner sidewall of FIG. 1. FIG. 2B is a schematic diagram illustrating another side of the sliding member of FIG. 2A.

Referring to FIG. 1, FIG. 2A and FIG. 2B, the power supply 10 includes a housing 100, a sliding member 110, a plurality of terminals 120 and a fan module 130. The housing 100 has an opening 102 and an inner sidewall 104. The terminals 120 are disposed on the sliding member 110 and are capable of slidably moving parallel to the inner sidewall 104. The fan module 130 can be mounted in the housing 100 from the opening 102. A terminal connector 134 is disposed on an outer sidewall 132 of the fan module 130, and is located on a moving direction of the terminals 120, so that the terminal connector 134 is suitable for being electrically connected to the terminals 120. Moreover, a circuit board 122 is fixed on the sliding member 110, and the terminals 120 are disposed on the circuit board 122, and are electrically connected to the circuit board 122. In the present embodiment, shapes and types of the terminals 120 are not limited, which can be golden fingers or the other signal terminals having the same function.

In the present embodiment, the terminals 120 can be terminals of a male joint 124, which are exposed outside the male joint 124, while the terminal connector 134 is, for example, a female joint, which is used for containing the terminals of the male joint 124. However, in another embodiment that is not illustrated, the terminals can also be terminals of a female joint, which are embedded in the female joint, while the terminal connector is, for example, a male joint, which is suitable for inserting into the female joint.

Referring to FIG. 2A and FIG. 2B, the sliding member 110 is disposed on the inner sidewall 104 of the housing 100, and the siding member 110 has at least one fixing slot 112 (two fixing slots are illustrated) parallel to the inner sidewall 104. Moreover, the housing 100 has a plurality of convex pillars 106 disposed on the inner sidewall 104. The convex pillars 106 are respectively buckled in the corresponding fixing slots 112, so that the sliding member 110 can be stably assembled on the inner sidewall 104. In the present embodiment, the fixing slot 112 is, for example, a bellmouth hole, while the convex pillar 106 is, for example, a cylinder having a T-shaped head. During the assembling, the T-shaped head of the convex pillar 106 can penetrate through one end of the bellmouth hole with a larger aperture, and can be moved towards another end thereof with a smaller aperture, so that the convex pillars 106 can be buckled in the corresponding fixing slots 112.

Moreover, referring to FIG. 2A, the inner sidewall 104 has an assembling hole 108a, which is, for example, a long hole, and the sliding member 110 is configured with an assembling member 114 (for example, a screw) corresponding to the assembling hole 108a. The assembling member 114 penetrates through the assembling hole 108a from external of the housing 100, and is fixed on the sliding member 110. The assembling hole 108a has a horizontal length L, and an outer diameter of the assembling member 114 is less than the horizontal length L of the assembling hole 108a, so that the assembling member 114 is capable of horizontally moving within the assembling hole 108a, and a horizontal moving distance of the sliding member 110 is approximately equal to the horizontal length L of the assembling hole 108a.

Moreover, referring to FIG. 2A, the inner sidewall 104 further has a locking hole 108b, which is, for example, a round hole located adjacent to the assembling hole 108a, while the sliding member 110 is configured with a locking member 116 (for example, a screw) corresponding to the locking hole 108b. The locking member 116 penetrates through the locking hole 108b from external of the housing 100, and is fixed on the sliding member 110. A position of the sliding member 110 can be temporarily fixed by the locking member 116, so that shaking of the sliding member 110 is prevented to avoid a poor contact of the terminals 120. Once the locking member 116 is removed, the mentioned function of the sliding member 110 is restored.

Referring to FIG. 1, the outer sidewall 132 of the fan module 130 has anti-collision tenon 136 located adjacent to a bottom surface of the fan module 130. When the fan module 130 is mounted in the housing 100 from the opening 102, since an assembling space of the fan module 130 is small, it is not easy to be assembled, and the fan module 130 is liable to collide the terminals 120 on the inner sidewall 104. To avoid colliding the terminals 120 having a weaker structural strength, the anti-collision tenon 136 protruding out from the outer sidewall 132 of the fan module 130 is used, so that if the anti-collision tenon 136 collides an upper edge of the sliding member 110, it can pre-warn a collision between the fan module 130 and the sliding member 110. Now, an assembler can determine that the sliding member 110 is probably not located at its initial position, and can stop continually moving downwards the fan module 130, so as to avoid colliding the terminals 120 having a weaker structural strength. If the anti-collision tenon 136 does not collide the upper edge of the sliding member 110, the assembler can determine that the sliding member 110 is located at its initial position, so that the assembler can continually move downwards the fan module 130 to a desired position without damaging the tell terminals 120 on the sliding member 110.

Referring to FIG. 1, the sliding member 110 has a buckle plate 118, which is, for example, located at the upper edge of the sliding member 110. The outer sidewall 132 of the fan module 130 has a positioning tenon 138, which is, for example, located adjacent to a top surface of the fan module 130. When the sliding member 110 is horizontally moved along the inner sidewall 104, the buckle plate 118 can be buckled to the positioning tenon 138. Now, the fan module 130 is in a buckling state at a horizontal direction, and the fan module 130 cannot be arbitrarily withdrawn, so as to avoid damaging the terminals 120 on the sliding member 110. Now, the terminals 120 on the sliding member 110 are inserted in the terminal connector 134 of the fan module 130, so that the terminals 120 are electrically connected to the terminal connector 134, and can stably receive external power or signals.

According to the above descriptions, the fan module is first mounted in the housing, and after a position of the fan module is determined to be correct, the sliding terminals are moved towards the terminal connector, and are electrically connected to the terminal connector. Compared to a conventional fan module, the two-step assembling method of the present invention can prevent circumstances of excessive current, abnormal assembling or misoperation to avoid damaging the fan module. Meanwhile, the anti-collision tenon is configured on the fan module, so as to avoid colliding the exposed terminals during the assembling.

In summary, in the present invention, the sliding member and the terminals are configured in the power supply, so that the terminals are capable of slidably moving parallel to the inner sidewall, and are electrically connected to the terminal connector. Moreover, the sliding member can be temporarily fixed through the locking member, so that shaking of the sliding member is prevented to avoid a poor contact of the terminals. Further, the outer sidewall of the fan module has an anti-collision tenon, which can pre-warn a collision between the fan module and the sliding member, so as to avoid the fan module colliding the terminals with a weaker structural strength, and increase a service lifespan thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A power supply, comprising:
a housing, having an opening and an inner sidewall;
a sliding member, disposed on the inner sidewall of the housing, and having a plurality of fixing slots parallel to the inner sidewall;
a plurality of terminals, disposed on the sliding member, and capable of slidably moving parallel to the inner sidewall; and a fan module, mounted in the housing from the opening, and an outer sidewall of the fan module having a terminal connector located on a moving direction of the terminals, so that the terminal connector is suitable for being electrically connected to the terminals.

2. The power supply as claimed in claim 1, further comprising a circuit board fixed on the sliding member, wherein the terminals are disposed on the circuit board and are electrically connected to the circuit board.

3. The power supply as claimed in claim 1, wherein the housing has a plurality of convex pillars disposed on the inner sidewall, and the convex pillars are respectively buckled in the fixing slots.

4. The power supply as claimed in claim 1, wherein the inner sidewall has an assembling hole, and the sliding member is configured with an assembling member corresponding to the assembling hole, the assembling member penetrates through the assembling hole from external of the housing, and is fixed on the sliding member, and the assembling member is capable of horizontally moving within the assembling hole.

5. The power supply as claimed in claim 4, wherein the inner sidewall has a locking hole, and the sliding member is configured with a locking member corresponding to the locking hole, the locking member penetrates through the locking hole from external of the housing, and is fixed on the sliding member.

6. The power supply as claimed in claim 1, wherein the outer sidewall of the fan module has an anti-collision tenon used for pre-warning a collision between the fan module and the sliding member.

7. The power supply as claimed in claim 1, wherein the sliding member has a buckle plate, and the outer sidewall of the fan module has a positioning tenon, and the buckle plate is buckled to the positioning tenon.

\* \* \* \* \*